(12) United States Patent
Song

(10) Patent No.: US 11,276,664 B2
(45) Date of Patent: Mar. 15, 2022

(54) METHOD FOR MANUFACTURING BONDING WIRE AND MANUFACTURING APPARATUS THEREOF

(71) Applicant: Mun-Sub Song, Gyeonggi-do (KR)

(72) Inventor: Mun-Sub Song, Gyeonggi-do (KR)

( * ) Notice: Subject to any disclaimer, the term of this patent is extended or adjusted under 35 U.S.C. 154(b) by 0 days.

(21) Appl. No.: 16/771,471

(22) PCT Filed: Dec. 10, 2018

(86) PCT No.: PCT/KR2018/015609
§ 371 (c)(1),
(2) Date: Jun. 10, 2020

(87) PCT Pub. No.: WO2019/117562
PCT Pub. Date: Jun. 20, 2019

(65) Prior Publication Data
US 2021/0020598 A1  Jan. 21, 2021

(30) Foreign Application Priority Data

Dec. 11, 2017 (KR) .......... 10-2017-0169272
Dec. 11, 2017 (KR) .......... 10-2018-0068043

(51) Int. Cl.
*B22D 11/00* (2006.01)
*H01L 23/00* (2006.01)
*B22D 11/124* (2006.01)
*B22D 11/14* (2006.01)

(52) U.S. Cl.
CPC .......... *H01L 24/745* (2013.01); *B22D 11/005* (2013.01); *B22D 11/124* (2013.01); *B22D 11/14* (2013.01); *H01L 2224/745* (2013.01)

(58) Field of Classification Search
CPC ..... B22D 11/14; B22D 11/124; B22D 11/005; B22D 11/007; B22D 11/008; B22D 11/041; B22D 11/10; B22D 11/103; B22D 11/106; B22D 19/14; B22D 19/16; H01L 24/745; H01L 2224/745
See application file for complete search history.

(56) References Cited

U.S. PATENT DOCUMENTS 3,470,939 A * 10/1969 Coad .................... B22D 11/008
164/505

FOREIGN PATENT DOCUMENTS

JP    2006190763    7/2006
KR    2014003111    3/2014

* cited by examiner

*Primary Examiner* — Kevin P Kerns
*Assistant Examiner* — Steven S Ha
(74) *Attorney, Agent, or Firm* — IPLA P.A.; James E. Bame

(57) ABSTRACT

A method for manufacturing a bonding wire includes: putting a surface layer metal of a bonding wire in a crucible having a die cooler provided at the lower part thereof and melting the same; putting a main component metal core of the bonding wire in a core guide located at the upper part of the die cooler of the crucible and heating the core guide to the melting point or below of the metal core; transferring the metal core toward the die cooler so as to allow the molten surface layer metal to be injected to the surface of the metal core; and manufacturing a 50 μm to 350 μm bonding wire from the cast wire precursor by using a drawing die.

5 Claims, 3 Drawing Sheets

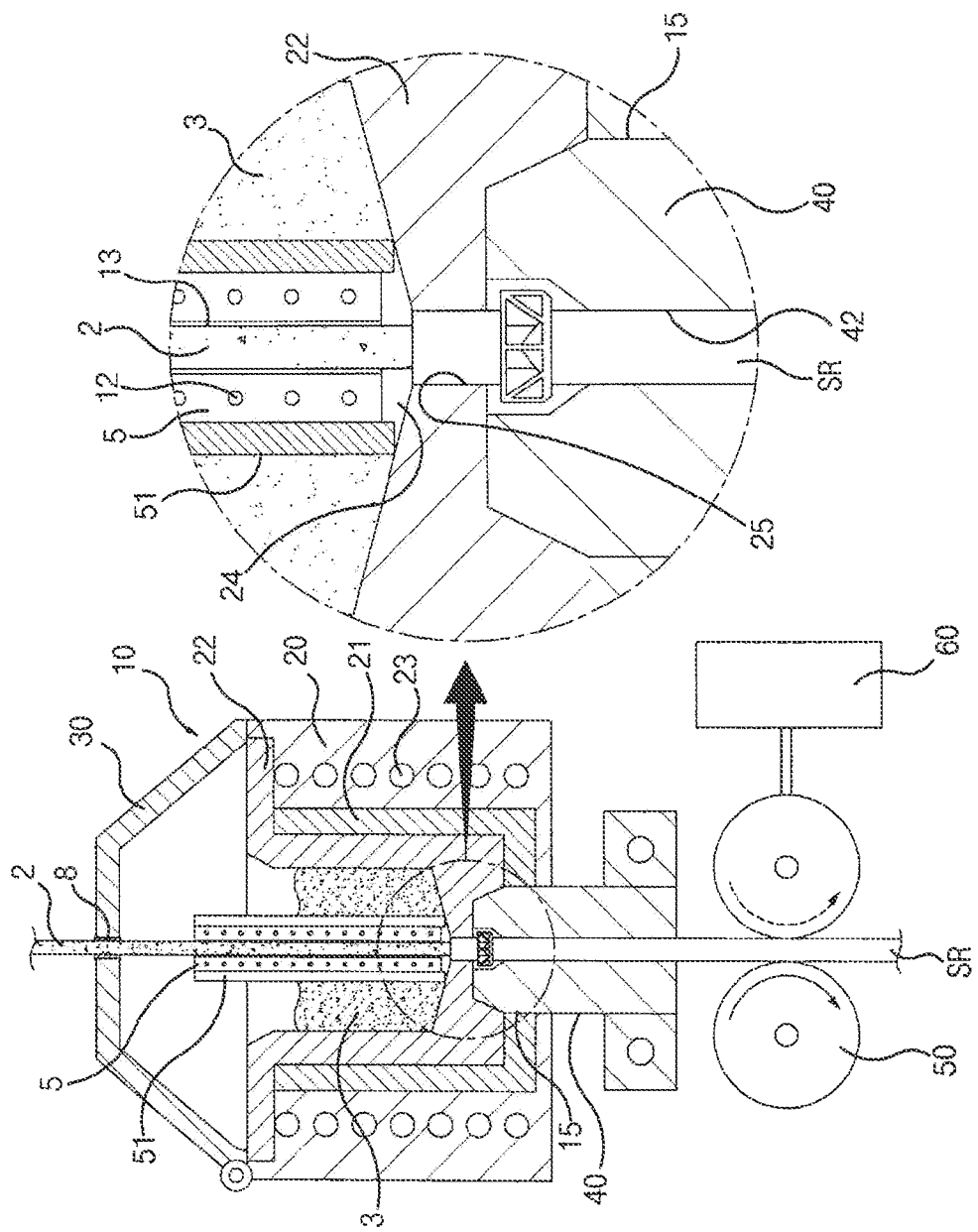

METHOD FOR MANUFACTURING BONDING WIRE AND MANUFACTURING APPARATUS THEREOF

BACKGROUND

The present invention relates to a method for manufacturing a bonding wire and a manufacturing apparatus thereof, and more particularly, to a method for manufacturing a bonding wire and a manufacturing apparatus thereof in which a surface metal made of at least one selected from the group consisting of gold (Au), palladium (Pd), platinum (Pt), and silver alloys (alloys of silver and platinum, palladium, rhodium, and iridium) or an alloy thereof is melt-bonded onto a surface of a core metal made of at least one selected from the group consisting of silver (Ag), copper (Cu), and aluminum (Al) or an alloy thereof to prepare a mother wire having an intermetallic phase intermediate layer between the core metal and the surface metal and the prepared mother wire is drawn at least one time by a die drawing machine to manufacture the bonding wire.

A bonding wire is essentially used in a manufacturing process of a semiconductor device to electrically connect an integrated circuit and a printed circuit board when manufacturing the semiconductor device. In addition, the bonding wire is used in power electronics applications to electrically connect a transistor, a diode, etc. to a pad or pins of a housing. Initially, the bonding wire was made of gold, but inexpensive metal materials such as silver, copper, and aluminum are used today.

In the present invention, the term of the bonding wire encompasses all cross-sectional shapes and all general wire diameters, but a bonding wire having a circular cross-section and a thin diameter is preferred.

Although a silver wire provides very good electrical conductivity and thermal conductivity, bonding of the silver wire has problems in the silver wire itself. Some recent researches and developments aim at bonding wires having a core metal based on silver as a main component because the price of silver is cheaper than gold. As such a prior art, in Korean Laid-open Patent Publication No. 10-2014-0031111 (published on Mar. 12, 2014; Patent Document 1), there is disclosed "a silver alloy wire for bonding applications". Nevertheless, there is a need to further improve a bonding wire technology with respect to the bonding wire itself and the bonding process.

A lot of researches have been conducted to replace the gold bonding wire, and for example, there is a bonding wire having copper as a main component. However, since a single-layered copper bonding wire is easily oxidized in the air, there may be a problem in bondability with a bonding pad or a lead. To improve this, a multi-layered copper bonding wire coating the surface of the single-layer copper bonding wire with another metal has been proposed in Japanese Laid-open Patent Publication No. 2006-190763 (published on Jul. 20, 2006; Patent Document 2).

The "bonding wire for the semiconductor device" described in Patent Document 2 is a bonding wire having a core material containing copper as a main component and a conductive metal surface layer having a different composition from that the core material. The main component of the surface layer is at least two selected from gold, palladium, platinum, rhodium, silver, or nickel, and a region having a concentration gradient of one or both of the main component metal or copper in the wire diameter direction is present in the surface layer.

In order to manufacture the multi-layered copper bonding wire described in Patent Document 2, when a heterogeneous metal is formed on a copper core and then a drawing process is performed several times while heat-treating, in some cases, the heterogeneous metal may be peeled off and the copper core may be exposed. When the copper core material is exposed as described above, the same problems as the single-layered copper bonding wire may occur, which may cause defects when applied to a semiconductor device.

In addition, there is also a need to improve the bondability to be bonded to the bonding pad or the lead for the multi-layered copper bonding wire. Since the purity of the copper selected as the core material is very high, the wire is bent after bonding and shorted by contact between adjacent wires, and thus there is a need to improve the straightness.

Such a bonding wire is formed of a core material which is main component of the wire and a surface layer, and a method of forming the surface layer on the core material includes a deposition method and a melting method.

As the deposition method, a physical vapor deposition method such as a sputtering method, an ion plating method, and vacuum vapor deposition, or a chemical vapor deposition method such as plasma enhanced chemical vapor deposition may be used. When the deposition method is used, since cleaning is not required after film formation, contamination problems caused by cleaning do not occur.

The melting method is a method of melting either the surface layer or the core material and injecting a molten metal into an unmolten metal. In addition, bonding wire may also be manufactured by injecting the molten surface layer metal around the core material prepared in advance to form the surface layer, and on the contrary, the bonding wire may also be manufactured by injecting the core material into a center of a hollow circumference of the surface layer prepared in advance.

However, the deposition method is to deposit the surface layer metal on the surface of a mother wire (e.g., a precursor in a step before the manufacturing of the bonding wire), and as a result, when the mother wire is manufactured to a bonding wire having a diameter of 50 μm to 350 μm by using a die drawing machine, there was a problem in that the surface layer metal is disconnected or peeled.

In addition, the melting method according to the prior art is to inject the molten metal around the core material prepared in advance, which cause a lot of difficulties in manufacturing. For example, when a surface layer metal such as molten gold is injected into the surface of a core material made of silver or the like, the molten surface layer metal does not sufficiently penetrate into the surface of the core material due to a large temperature difference between the molten surface layer metal and the core material, so that a binding force between the core material and the surface layer metal is deteriorated. In this state, when the mother wire was manufactured to the bonding wire having a diameter of 50 □m to 350 □m by the die drawing machine, there was a problem in that the surface layer metal is disconnected or peeled.

SUMMARY OF THE INVENTION

Therefore, the present invention is derived to solve the above-mentioned problems, and an object of the present invention is to provide a method for manufacturing a bonding wire and a manufacturing apparatus thereof capable of reducing a chip damage while preventing exposure of a core metal, which is a main component of the wire, even when performing a plurality of drawing processes and having excellent bondability of a second side where stitch bonding is performed.

Another object of the present invention is to provide a method for manufacturing a bonding wire and a manufacturing apparatus thereof, in which a surface layer metal to be melt-bonded onto the surface of a core metal is molten in a crucible, the molten surface layer metal is melt-bonded onto the surface of the core by heating the core metal constituting the component of the wire to continuously cast a precursor having an intermetallic phase intermediate layer which is formed on the surface of the core metal of the wire main component and in which the surface layer metal material and the core metal material are mixed, and the continuously cast precursor is die-drawn to manufacture the bonding wire.

A method for manufacturing a bonding wire of the present invention to achieve the objects comprises: putting and melting a surface layer metal of the bonding wire in a crucible having a die cooler provided at the lower part thereof; putting a main component core metal of the wire into a core guide located at the upper part of the die cooler of the crucible and heating the core guide to the melting point or below of the core metal to soften the core metal; transferring the core metal toward the die cooler so that the molten surface layer metal is melt-bonded onto the surface of the core metal and casting and preparing a bonding wire precursor having an intermetallic phase intermediate layer which is formed on the surface of the core metal and in which the surface layer metal material and the core metal material are mixed; and manufacturing the prepared bonding wire precursor to a bonding wire having a predetermined diameter by using a die drawing machine.

The surface layer metal may be any one selected from the group consisting of gold, palladium, platinum, and a silver alloy (an alloy of silver and platinum, palladium, rhodium, or iridium) or an alloy thereof and the metal core may be any one selected from silver, copper, and aluminum or an alloy thereof.

The method for manufacturing the bonding wire according to the present invention may be easily performed by using an apparatus for manufacturing a bonding wire comprising: a casting housing which has a die coupler formed at the lower part thereof and heats a heating furnace provided therein by an induction heating coil provided therearound; a crucible which has an outlet formed at the lower part thereof and melts a surface layer metal inserted into the heating furnace of the casting housing and put therein by heating the induction heating coil; a core guide which is spaced apart from an inner lower surface of the crucible to be provided toward the outlet and guides the core metal wire inserted into the hollow to be transferred toward the lower outlet of the crucible; a gate pole which is coupled to an outer circumferential surface of the core guide so as to ascend, prevents a molten material in the crucible from flowing toward the outlet by contacting a lower end thereof with an upper surface of the outlet of the crucible normally, and ascends during casting to form a flow passage from the inside of the crucible to the outlet; a die cooler which is projected above the inner surface of the crucible through the die coupler of the casting housing and bonds the surface layer metal molten in the crucible onto the surface of the core metal wire transferred to the lower outlet through the core guide by ascending of the gate pole to cast and cool a wire precursor having an intermetallic phase intermediate layer which is formed on the surface of the core metal wire and in which the surface layer metal material and the core metal material are mixed; and a die drawing machine which draws the wire precursor in the die cooler to a wire having a diameter of 50 µm to 350 µm.

The core guide may be made of the same material as the crucible and an induction heating coil may be provided inside the core guide to heat the core metal to the melting point or below of the core metal.

The surface layer metal may be any one selected from the group consisting of gold, palladium, platinum, and a silver alloy (an alloy of silver and platinum, palladium, rhodium, or iridium) or an alloy thereof and the metal core may be any one selected from silver, copper, and aluminum or an alloy thereof.

The term "intermediate layer" in the present invention is a region of the wire between the core metal and the surface layer metal. In this region, the material in the core metal as well as the material in the surface layer metal are present in combination, for example, in the form of at least one intermetallic phase.

The term "intermetallic phase" in the context of the present invention refer to phases of two or more metals, and as a region where different elements are different in the structure is used for defining phases where the regions are regularly disposed in regions having separate local environments and often well-defined and fixed stoichiometry. This is a difference for alloys in which different elements are randomly dispersed.

According to the method for manufacturing the bonding wire according to the embodiment of the present invention, it is possible to improve bondability of the second side where the stitch bonding is performed by casting the wire precursor having the intermetallic phase intermediate layer which is formed on the surface of the core metal and in which the surface layer metal material and the core metal material are mixed and drawing the cast wire precursor by the die drawing process to prevent the surface layer from being peeled or disconnected. Further, it is possible to reduce the material cost of the bonding wire.

BRIEF DESCRIPTION OF DRAWINGS

FIG. 3 is a cross-sectional view of an apparatus for manufacturing a bonding wire according to a prepared embodiment of the present invention, in which FIG. 3A is a view illustrating a state before a bonding wire precursor is cast and FIG. 3B is a view illustrating a state in which the bonding wire precursor is cast.

DETAILED DESCRIPTION OF THE INVENTION

Hereinafter, a preferred embodiment of the present invention will be described in more detail with reference to the accompanying drawings. In addition, it should be understood that the present invention can be implemented in many different forms and is not limited to embodiments to be described. It should be noted that the embodiments of the present invention to be described below are intended to sufficiently deliver the spirit of the present invention to those skilled in the art.

Figure 1:
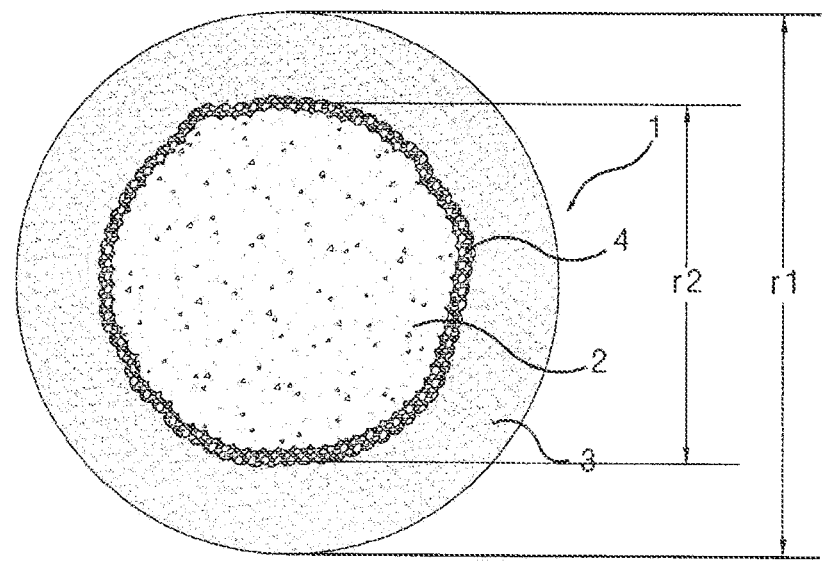
FIG. 1 is a horizontal cross-sectional view of a bonding wire manufactured according to a prepared embodiment of the present invention.
Figure 2:
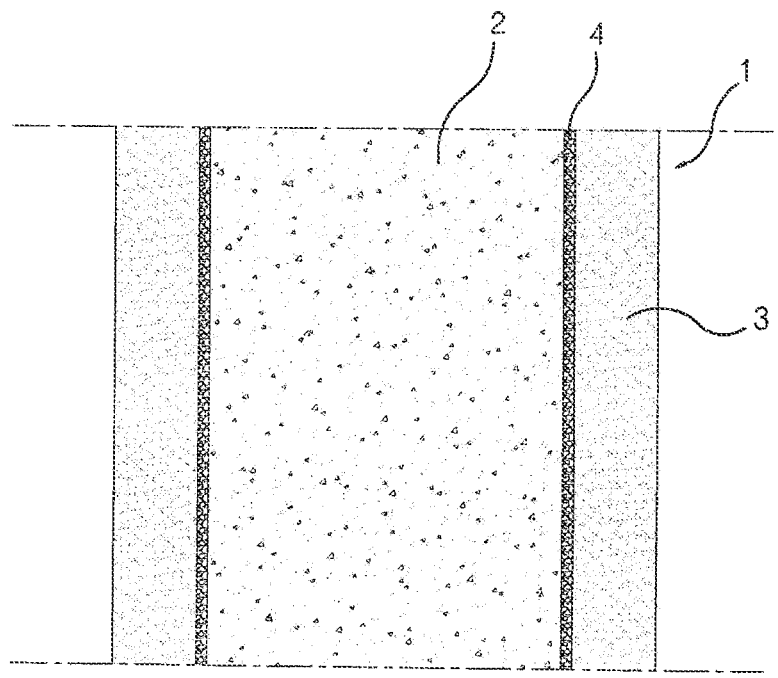
FIG. 2 is a vertical cross-sectional view of the bonding wire manufactured according to the prepared embodiment of the present invention.

FIGS. 1 and 2 illustrate horizontal and vertical cross-sectional views of a wire 1 manufactured according to a preferred embodiment of the present invention. In the cross-sectional views, a core metal 2 is disposed in the center. The core metal 2 is surrounded by a surface layer metal 3, and an intermediate layer 4 is formed between the core metal 2 and the surface layer metal 3.

At this time, the intermediate layer 4 is formed by melt-bonding a surface metal material made of at least one selected from the group consisting of gold (Au), palladium (Pd), platinum (Pt) or a silver alloy (an alloy of silver and platinum, palladium, rhodium, or iridium) of 99.99% purity or an alloy thereof onto the surface of the wire made of at least one selected from the group consisting of silver (Ag), copper (Cu), and aluminum (Al) of 99.99% purity or an alloy thereof and injecting the material in the surface layer metal 3 into the core metal 2. That is, the surface layer metal 3 is melt-bonded onto the surface of the core metal 2 to be like a welded form.

As described above, since the intermediate layer 4 in which the surface layer metal 3 is melt-bonded onto the surface of the core metal 2 is an alloy of the core metal 2 and the surface layer metal 3, the straightness of the wire 1 is improved. That is, the elasticity of the bonding wire 1 is increased by the formation of the intermediate layer 4, so that a phenomenon of being in contact between adjacent wires during stitch bonding is greatly reduced.

At this time, a total diameter r1 including the surface layer in the bonding wire 1 is 30 □m to 350 □m, and a diameter r2 of the core metal 2 has a size of 70% to 80% of the total diameter r1.

The bonding wire 1 illustrated in FIGS. 1 and 2 may be manufactured by a manufacturing apparatus of FIG. 3.

A process of manufacturing the bonding wire 1 according to the present invention will be described with reference to FIGS. 3A and 3B.

Figure 3B:
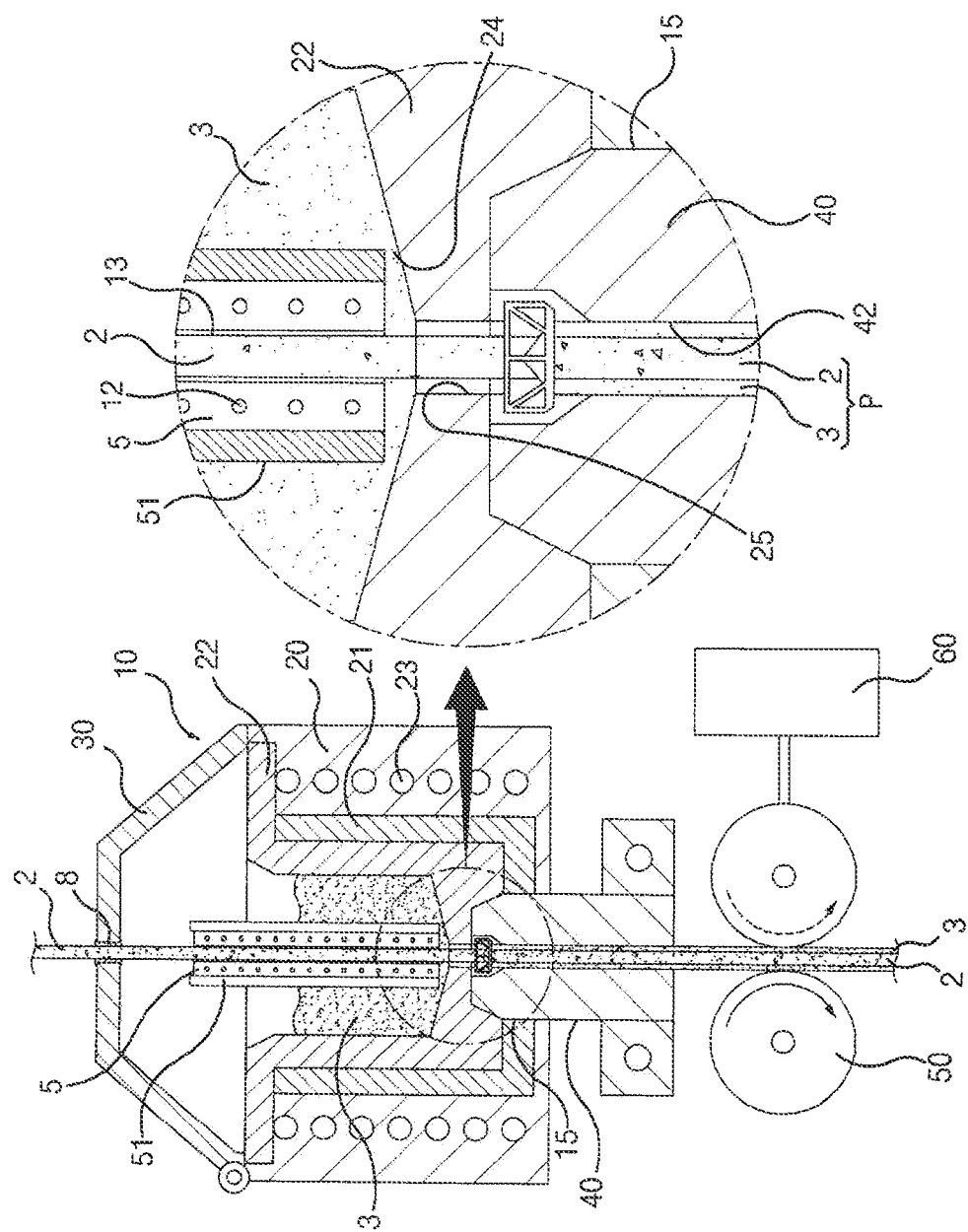

Referring to FIGS. 3A and 3B, an apparatus for manufacturing the bonding wire 10 has a die coupler 15 formed at the lower part thereof and a casting housing 20 heating a heating furnace 21 provided therein by an induction heating coil 23 provided therearound.

A crucible 22 having an outlet 25 formed at the lower part thereof is seated on the heating furnace 21 of the casting housing 20. The crucible 22 melts the surface layer metal 3 put therein by heat conduction of the heating furnace 21 heated by heating the induction heating coil 23, for example, a surface layer metal made of any one selected from the group consisting of gold (Au), palladium (Pd), platinum (Pt), and a silver alloy (an alloy of silver and platinum, palladium, rhodium, or iridium) or an alloy thereof. At this time, an internal temperature of the crucible 22 is maintained at about 1,100° C. to 2,000° C. depending on the melting point of the surface layer metal 3 to be put therein.

A core guide 5 having a hollow 13 is provided inside the crucible 22. A gate pole 51 is coupled to a circumference of an outer circumferential surface of the core guide 5 so as to ascend. The gate pole 51 prevents a molten material in the crucible 22 from flowing to the outlet 25 by contacting a lower part of the gate pole 51 with an upper surface of the outlet 25 of the crucible 22 normally and ascends during casting to form a flow passage 24 from the inside of the crucible 22 to the outlet 25.

At this time, the core guide 5 and the gate pole 51 may use a core guide and a gate pole which are made of the same material as the crucible 22, for example, carbon. In addition, an induction heating coil 12 for heating the core metal 2 inserted into the hollow 13 may be provided inside the core guide 5.

The core guide 5 is provided to be spaced apart from the outlet 25 formed at the lower part of the crucible 22. That is, the core guide 5 is spaced apart from an inner lower surface of the crucible toward the outlet 25, and the gate pole 51 opens the flow passage 24 toward the core guide 5 at the lower part of the crucible 22 by ascending.

The core guide 5 having the above configuration guides the wire of the core metal 2, which is the main component of the bonding wire inserted into the hollow 13, to be transferred toward the lower outlet 25 of the crucible 22.

The induction heating coil 12 provided inside the core guide 5 is heated at an appropriate temperature according to the material of the core metal 2.

For example, when the core metal 2 is silver (Ag), the induction heating coil 12 is heated to a temperature of 750° C. to 900° C., and when the core metal 2 is aluminum, the induction heating coil 12 is heated to 450° C. to 600° C. In addition, when core metal 2 is the copper (Cu), the induction heating coil 12 is heated to 900° C. to 800° C. and then put into the hole 13 to soften the structure of the core metal 2 transferred downward.

As such, the melting point of the surface layer metal 3 made of any one metal of gold (Au), palladium (Pd), platinum (Pt), and a silver alloy (an alloy of silver and platinum, palladium, rhodium, or iridium) or an alloy thereof which is molten in the crucible 22 is 1,063° C. to 1,773° C. Accordingly, the reason for selectively controlling the induction heating coil 12 according to the material of the core metal 2 is that the melt-bonding of gold (Au) as the surface layer metal 3 is better performed by softening a metal structure of the wire of the copper (Cu) core metal 2 transferred from the inside thereof by heating the temperature of the core guide 5 to 800° C. to 1,000° C. when copper (Cu) has been used as the core metal 2.

The die coupler 15 formed in the lower part of the casting housing 20 is inserted and coupled with a die of the die cooler 40, and an extruder 42 of the die is closely coupled to the outlet 25 formed at the lower part of the crucible 22.

A cover 30 is hinged to an upper part of the casting housing 20. The inner crucible 22 of the casting housing 20 may be vacuumed after the cover 30 is closed, and may be filled with atmospheric gas, for example, nitrogen in order to prevent oxidation of the wire of the core metal 2 which is put and transferred into the hollow 23 of the core guide 5.

A discharge roller 50 is provided on a discharge path of the die cooler 40, and a distance of the discharge roller 50 is adjusted by a pneumatic cylinder 60 to hold and discharge a starter rod SR or a wire precursor P.

Although not illustrated in the drawings, at least one die drawing machine is provided at a rear end of the discharge roller 50. The die drawing machines draw the wire precursor P manufactured in the apparatus for manufacturing the bonding wire 10 to manufacture a bonding wire having 30 □m to 350 □m.

When the surface layer metal 3 made of any one metal selected from gold (Au), palladium (Pd), platinum (Pt), and a silver alloy (an alloy of silver and platinum, palladium, rhodium, or iridium) or an alloy thereof is put into the crucible 22 of the apparatus for manufacturing the bonding wire 10 configured above, the surface layer metal 3 put into the crucible 22 is molten by the heating of the induction heating coil 23.

As described above, while the surface layer metal 3 put into the crucible 22 is molten, when the core metal 2 made of any one selected from silver (Ag), copper (Cu), and aluminum (Al) or an alloy thereof is put into the hollow 13 of the core guide 5 to be transferred to the lower part thereof, the molten surface layer metal 3 is melt-bonded onto the surface of the core metal 2 through a gap 24 between the core guide 5 and the crucible 22 and the material of the surface layer metal 3 is injected into the surface layer of the core metal 2 to form the intermediate layer 4 as illustrated in FIG. 1. The intermediate layer 4 is a region of the wire between the core metal made of silver and the surface layer metal. In this region, the material in the core as well as the material in the surface layer metal are present in combination, for example, in the form of at least one intermetallic phase.

EXAMPLE

In order to prepare the wire precursor P for manufacturing the bonding wire 1 illustrated in FIGS. 1 and 2 by using the apparatus for manufacturing the bonding wire 10 illustrated in FIG. 3, as illustrated in FIG. 3A, the gate pole 51 coupled to slide up and down on an outer periphery of the core guide 5 descends, and as a result, the flow passage 24 needs to be closed and the starter rod SR needs to be inserted into the extruder 42 of the die cooler 40.

Thereafter, the cover 30 of the casting housing 20 is opened, the surface layer metal 3 made of any one selected from gold (Au), palladium (Pd), platinum (Pt), and a silver alloy (an alloy of silver and platinum, palladium, rhodium, or iridium) or an alloy thereof is put into the crucible 22, and then the cover 30 is closed.

In addition, the wire of the core metal 2 is inserted into the hollow of the core guide 5 provided at the lower part thereof through a packing hole 8 formed in the upper part of the cover 30. At this time, the surface of the wire of the core metal 2 may be used by coating borax.

After the cover 30 is closed, the inside of the casting housing 20 is vacuumed, and atmosphere gas, for example, nitrogen is filled to prevent the wire of the core metal 2 from being oxidized.

Thereafter, the induction heating coil 23 provided in the casting housing 20 is driven to heat the temperature of the crucible 22 to 1100° C. to 2000° C. and melt the surface layer metal which has been put therein. In addition, the induction heating coil 12 provided inside the core guide 5 is heated to a predetermined temperature.

For example, if the surface layer metal is gold (Au) and the wire of the core metal 2 is silver (Ag), the temperature of the core guide 5 is heated to a temperature of 750° C. to 900° C. The structure of the wire of the core metal 2 which is put and transferred into the hollow of the core guide 5 is softly softened by the above heating.

As such, when the structure of the core metal 2 is softened while the surface layer metal put in the crucible 22 is molten, the gate pole 51 ascends to open a part of the inner bottom surface of the crucible 22 and form the flow passage 24. In this state, when the core metal 2 is put into the hollow 13 of the core guide 5 and transferred to the lower part thereof, the molten surface layer metal 3 is melt-bonded onto the surface of the core metal 2 through the flow passage 24 between the core guide 5 and the crucible 22. At this time, the melt-bonding is strongly performed by the borax coated on the surface of the wire of the core metal 2.

When the wire of the core metal 2 is transferred through the hollow 23 of the core guide 5 while the core guide 5 is heated, the structure of the core metal 2 passing through the core guide 5 is softened softly by heating the induction heating coil 12. As a result, when the core metal 2 passes through the gap 24 between the core guide 5 and the crucible 22, the molten surface layer metal 3 in the crucible 22 is easily melt-bonded onto the surface of the core metal 2 and the surface layer metal 3 is injected into the surface of the wire of the core metal 2 to form the intermediate layer 4.

The core metal 2 formed with the intermediate layer 4 adheres to the end of the starter rod SR.

In the above state, when the discharge roller 50 is rotated to withdraw the starter rod SR, the surface layer metal 3 melt-bonded onto the surface of the wire of the core metal 2 is continuously cast by the die cooler 40 and then discharged as illustrated in FIG. 3B to prepare the wire precursor P. At this time, a transfer speed of the wire of the core metal 2 transferred to the hollow of the core guide 5 and a transfer speed of the precursor P discharged by the discharge roller 50 are the same as each other. Therefore, in the configuration illustrated in FIG. 3A, when the starter rod SR is withdrawn by the discharge roller 50 as illustrated in FIG. 3B, the precursor P is continuously cast.

At this time, the wire precursor P is formed with the intermediate layer 4 as illustrated in FIG. 1. The intermediate layer 4 is a region of the wire between the core metal made of silver and the surface layer metal. In this region, the material in the core as well as the material in the surface layer metal are present in combination, for example, in the form of at least one intermetallic phase.

The die cooler 40 cools the cast precursor P. The precursor P cast and cooled by the die cooler 40 is supplied to a die drawing machine (not illustrated) through the discharge roller 50. At least one die drawing machine is used, and finally, the bonding wire drawn with a diameter of 30 μm to 350 μm is manufactured.

EXPLANATION OF NUMERAL REFERENCES AND SYMBOLS

| | |
|---|---|
| 1: Bonding wire | 2: Core metal |
| 3: Surface layer metal | 4: Intermediate layer |
| 5: Core guide | 10: Apparatus for manufacturing bonding wire |
| 12: Induction heating coil | 13: Hollow |
| 15: Die coupler | 20: Casting housing |
| 21: Heating furnace | 22: Crucible |
| 23: Induction heating coil | 24: Flow passage |
| 25: Outlet | 30: Cover |
| 40: Die cooler | 42: Die extruder |
| 50: Discharge roller | 51: Gate pole |
| 60: Pneumatic cylinder | |

The invention claimed is:

1. A method for manufacturing a bonding wire comprising:
    putting and melting a surface layer metal of the bonding wire in a crucible having a die cooler provided at a lower part thereof;
    putting a main component core metal of the wire into a hollow of a core guide located at an upper part of the die cooler of the crucible and heating the core guide to the melting point or below of the core metal to soften a structure of the core metal;
    transferring a softened core metal toward the die cooler so that a molten surface layer metal is melt-bonded onto the surface of the softened core metal and casting and preparing a bonding wire precursor having an intermetallic phase intermediate layer which is formed on the surface of the softened core metal and in which a surface layer metal material and the core metal material are mixed; and cooling the prepared bonding wire precursor by the die cooler and drawing the cooled bonding wire precursor at least one time by a die drawing machine to manufacture a bonding wire having a predetermined diameter.

2. The method for manufacturing the bonding wire of claim 1, wherein the surface layer metal is any one selected from gold, palladium, platinum, and silver and the metal core is any one selected from silver and copper.

3. An apparatus for manufacturing a bonding wire comprising:

a casting housing which has a die coupler formed at a lower part thereof and heats a heating furnace provided therein by an induction heating coil provided therearound;

a crucible which has an outlet formed at a lower part thereof and melts a surface layer metal inserted into the heating furnace of the casting housing and put therein by heating the induction heating coil;

a core guide which is spaced apart from an inner lower surface of the crucible to be provided toward the outlet and guides a core metal wire inserted into a hollow to be transferred toward a lower outlet of the crucible;

a gate pole which is coupled to an outer circumferential surface of the core guide so as to ascend, prevents a molten material in the crucible from flowing toward the outlet by contacting a lower end thereof with an upper surface of the outlet of the crucible normally, and ascends during casting to form a flow passage from the inside of the crucible to the outlet;

a die cooler which is projected above the inner surface of the crucible through the die coupler of the casting housing and bonds the surface layer metal molten in the crucible onto the surface of the core metal wire transferred to the lower outlet through the core guide by ascending of the gate pole to cast and cool a wire precursor having an intermetallic phase intermediate layer which is formed on the surface of the core metal wire and in which the surface layer metal material and the core metal material are mixed; and a die drawing machine which draws the wire precursor in the die cooler to a wire having a diameter of 50 µm to 350 µM.

4. The apparatus for manufacturing the bonding wire of claim 3, wherein the core guide is made of the same material as the crucible and an induction heating coil is provided inside the core guide to heat the core metal to the melting point or below of the core metal.

5. The apparatus for manufacturing the bonding wire of claim 3, wherein the surface layer metal is any one selected from gold, palladium, platinum, and silver and the metal core is any one selected from silver, copper, and aluminum.

* * * * *